United States Patent [19]

Müller et al.

[11] Patent Number: 4,467,208

[45] Date of Patent: Aug. 21, 1984

[54] RADIATION SENSOR CONTAINING FLUORESCIBLE MATERIAL

[75] Inventors: Gerhard Müller; Albert Kreuttner, both of Aalen, Fed. Rep. of Germany

[73] Assignee: Carl-Zeiss-Stiftung, Heidenheim/Brenz, d/b/a Carl Zeiss, Oberkochen, Oberkochen, Fed. Rep. of Germany

[21] Appl. No.: 374,711

[22] Filed: May 4, 1982

[30] Foreign Application Priority Data

May 16, 1981 [DE] Fed. Rep. of Germany ....... 3119570

[51] Int. Cl.³ ................................................. G01J 5/08
[52] U.S. Cl. ................................... 250/483.1; 250/227
[58] Field of Search ............... 250/483.1, 487.1, 488.1, 250/461.1, 458.1, 551, 227; 356/317

[56] References Cited

U.S. PATENT DOCUMENTS

| 2,827,825 | 3/1958 | White | 356/301 |
|---|---|---|---|
| 4,262,206 | 4/1981 | Viehmann | 250/483.1 |
| 4,371,897 | 2/1983 | Kramer | 358/294 |
| 4,403,152 | 9/1983 | Schmid et al. | 250/551 |
| 4,418,338 | 11/1983 | Burt | 340/578 |

Primary Examiner—Janice A. Howell
Assistant Examiner—Constantine Hannaher
Attorney, Agent, or Firm—Hopgood, Calimafde, Kalil, Blaustein & Judlowe

[57] ABSTRACT

The invention contemplates a radiation sensor containing material which will fluoresce upon incidence of radiation to be detected, wherein the sensor comprises an elongate cylindrical and fluorescible collector core with a cladding wall of material that is transparent to the wavelength of radiation to be detected, and wherein at least one detector which is sensitive to the fluorescent radiation is coupled to at least one of the ends of the cylindrical collector.

9 Claims, 5 Drawing Figures

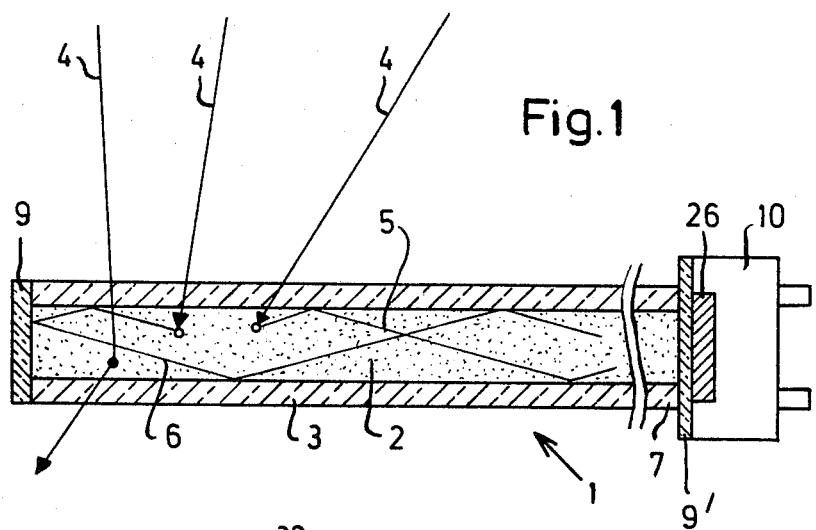
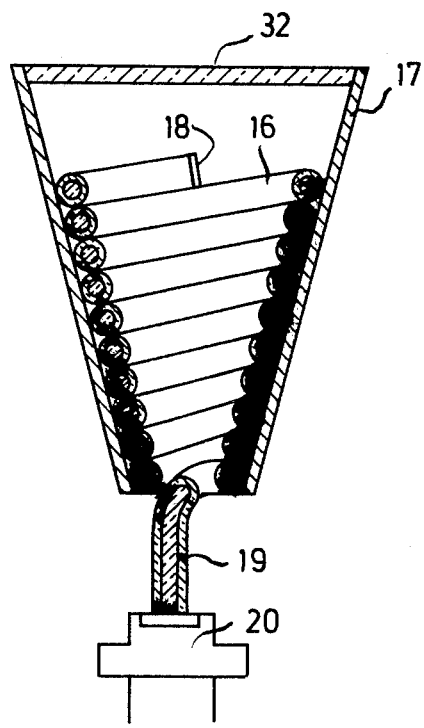

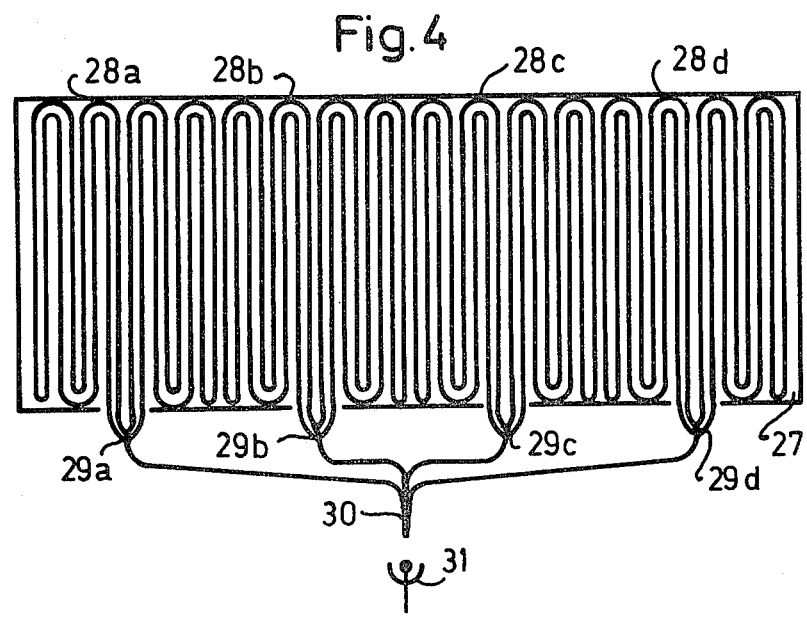
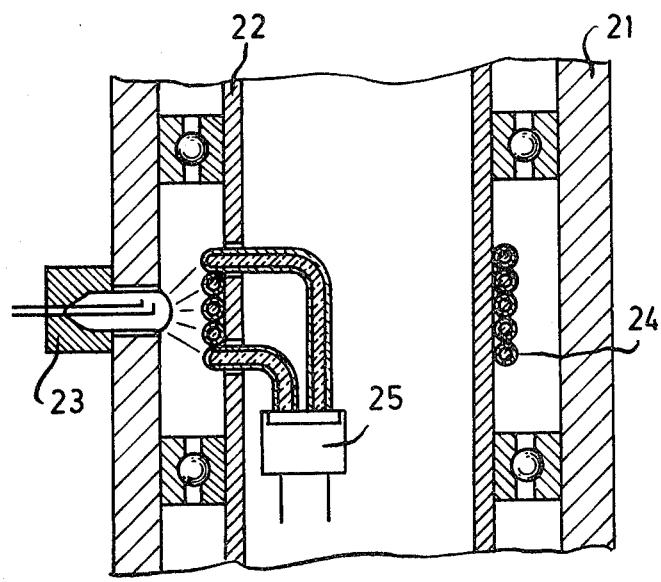

RADIATION SENSOR CONTAINING FLUORESCIBLE MATERIAL

BACKGROUND OF THE INVENTION

The present invention relates to a radiation sensor which contains fluorescible material and in which radiation to be detected is absorbed to produce fluorescent light, which light is conducted onto the photosensitive surface of a detector.

In the manufacture of sensors for the short-wave spectral region (UV), it becomes a disturbingly noticeable fact that on the one hand the quantum efficiency of conventional detectors progressively decreases with decrease in the wavelength and, at the same time, it becomes increasingly difficult to find material suitable for concentrating or focusing the radiation.

It is known that quantum yield of semiconductor radiation sensors which perform worse in the direction toward short wavelengths, can be improved by arranging in front of the photoelectric detector proper a layer containing a fluorescible material which is excited by radiation to be detected. The fluorescent light thereby produced is then detected by a detector which is sensitive to the fluorescence wavelength. An x-ray sensitive sensor of this construction has been described, for instance in West German published patent application (Offenlegungsschrift) OS No. 2,041,523.

In this known sensor the size of the detected radiation cone is determined by the area of the photo-sensitive region of the detector. There is no collection or concentration of radiation to be detected, prior to impingement on the detector.

Solar-energy collectors for concentration of sunlight are known in the form of plastic plates which incorporate fluorescible dyestuffs. In such plates, the fluorescent radiation excited by the sunlight is conducted in part by inner total reflection at the top and/or bottom surface of the plate, to end surfaces which are partially covered with a reflective covering or on which solar cells are arranged for converting the fluorescent radiation into electric current.

In this way, a certain concentration can be obtained, for sunlight incident on the surfaces of the plates, the concentration being approximately in the ratio of the top or bottom surface area of the plate to the end-surface area. Despite this size reduction for the received beam, relatively large-area detectors are required for coverage of at least one of the end surfaces, for conversion into electricity. Further, such plates are rigid and unwieldy and are therefore unsuitable for sensor uses.

BRIEF STATEMENT OF THE INVENTION

It is an object of the invention to provide a radiation sensor of the character indicated, having improved response particularly at radiation wavelengths shorter than wavelengths of the visible spectrum.

The invention achieves this object by providing configurations which optimize the ratio of (a) radiation-exposed fluorescible-collector area to (b) the photo-sensitive area of the detector, and which conduct the fluorescent radiation with minimum loss to the sensitive area of the detector, thus obtaining the highest possible radiation density at the detector. More specifically, in the forms to be described, the sensor of the invention comprises a collector in the form of an elongate cylinder such as an optical fiber, having a wall of material transparent to the radiation to be detected and having a core which contains the fluorescible material; and at least one detector for the fluorescent radiation is coupled to at least one of the ends of the cylinder.

A sensor constructed in this manner operates in the following manner: Radiation to be detected passes unimpeded through the wall of the cylinder or fiber, and into the core to thereby excite the latter to fluorescence. A large fraction of the fluorescent radiation, which radiates uniformly in all directions, is totally reflected on the inside of the wall and is thus conducted to the detector or detectors at one or both ends of the core. The sensor, therefore, utilizes a detector having a very small light-sensitive surface, which need merely be of area determined by the core diameter of the collector. The cylinder can be very long if there is no substantial absorption of the fluorescent light in the material of the core, so that practically any desired cross-section area can be covered, for radiation to be detected. Relatively dense light radiation is thus directed to the detector so that the sensor, which consists of both the collector and the detector, is even suitable for sensitive detection of diffuse radiation which cannot be focused by optical lenses or reflectors. In this connection, a cladding of the core serves to prevent such loss of fluorescent radiation as might otherwise result from dirt on the surface of the collector, and also to prevent the entrance of undesired stray light.

It is advantageous to develop the cylindrical collector as a glass or plastic fiber or as a capillary, since the collector which is in such case flexible can be wound into any desired shape, depending on the application desired. Suitable core material for the plastic fibers and for the capillary includes fluorescing organic dyestuffs contained in a thermoplastic carrier material or in a solvent. The glass fiber can on the other hand be drawn, using uranyl glass or neodymium glass as the core material.

The sensor of the invention can be used, inter alia, to monitor combustion or ignition processes in which UV emission occurs, for instance in power plants, turbines and airplane engines. Another particularly advantageous use of the collector is for the optical contact-less transfer of energy or signals between two relatively moving parts, in which case one of the parts carries a transmitter in the form of a short-wave-emitting energy or signal source, while the sensor is arranged on the second part and is so disposed with respect to the direction of movement that a part of the collector is always impinged by radiation transmitted from the source.

DETAILED DESCRIPTION

Various embodiments of the invention will be described, in conjunction with the accompanying drawings, in which:

FIG. 1 is a fragmentary view in longitudinal section, diagrammatically showing basic elements of a sensor of the invention;

FIGS. 2 and 3 are similar views to show first and second sensor embodiments of the invention;

FIG. 4 is a diagrammatic showing of a third sensor embodiment; and

FIG. 5 is a simplified vertical sectional view to show use of a sensor of the invention as an optical collector ring.

Figure 2:
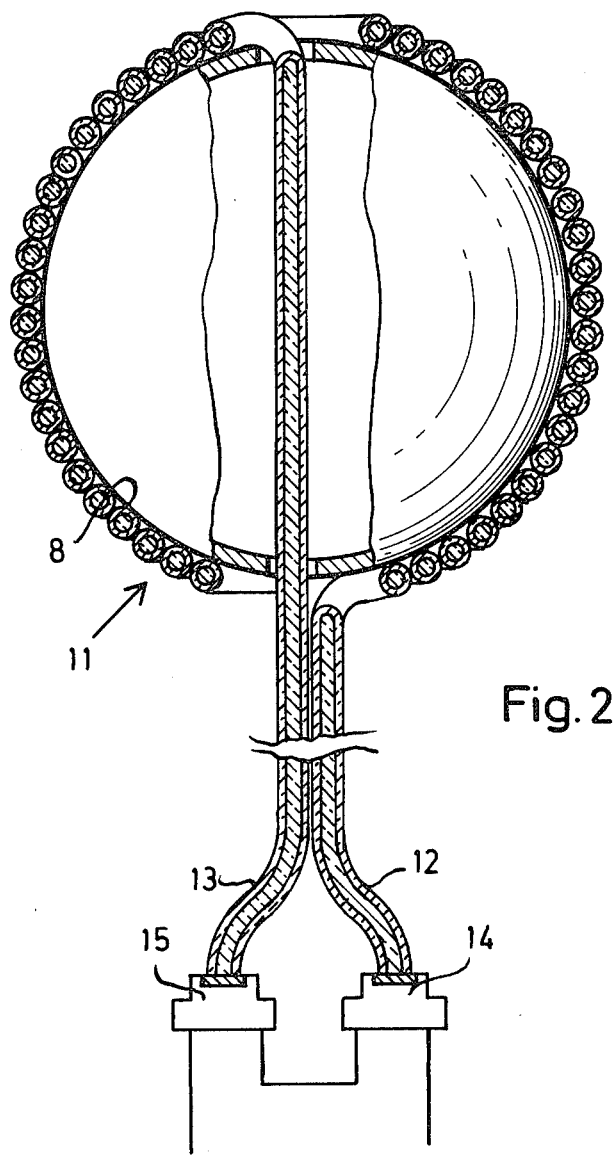

The radiation sensor of FIG. 1 comprises a collector 1 and a detector 10. Collector 1 is cylindrical and has a cladding wall 3 of glass which is transparent to radiation 4 to be detected. Wall 3 surrounds a core 2 containing a fluorescible substance which absorbs within the wavelength range of the radiation 4 to be detected and which dampens emitted fluorescent radiation only slightly if at all. Core 2 has a higher index of refraction than wall 3, so that fluorescent radiation produced in the core is conducted, in part by total reflection at the core/wall interface, toward the ends of collector 1. One end of the collector is provided with a reflective layer 9, and therefore fluorescent light 5, 6 guided within the core impinges on the photosensitive layer 26 of detector 10, via a transparent layer 9' at the other end 7. Naturally, a part of the fluorescent light also emerges from the core when it impinges on the interface at a more obtuse angle than the limiting total-reflection angle determined by the different indices of refraction at interface of the two media 2 and 3.

In the embodiment of FIG. 2, a sensor 11 operates in accordance with the principle discussed in connection with FIG. 1. The sensor 11 utilizes a collector which has the thickness of an optical fiber, and which is wound to conform to the ball-like surface of a support 8. The ends 12 and 13 of the fiber are coupled to two detectors 14 and 15 which are sensitized to the fluorescence wavelength of the core material. The sensor has no directional response and is particularly suitable for the detection of diffuse radiation.

On the other hand, the sensor embodiment of FIG. 3 does have a directional response, being in the form of a helix 16 wound on the inside of a cone 17. The directional response is more pronounced the smaller the cone angle. The light-entrance opening of the sensor is covered by a filter 32 which exposes the sensor to the wavelength of the radiation to be detected and which prevents entrance of light of undesired wavelengths. Preferably, cone 17 is internally reflecting as to the radiation to be detected, and this is suggested in FIG. 3 by the cross-hatching of cone 17 for metal.

The sensor of FIG. 4 employs a collector comprising a plurality of bifilar-wound individual fibers 28a-b-c-d mounted in meandering array on a plate 27. The fiber ends are connected in groups to taper points 29a-d and then to each other by the taper 30, for coupling to a detector 31. The length of individual fibers can be kept short by connecting several fibers together in parallel. This is particularly advantageous when the core material exhibits a certain residual absorption at the fluorescent wavelength, in which case employment of fiber beyond a given length no longer produces any additional intensity at the ends. The lengths of optical fiber between tapers 29 and the detector 31 therefore preferably rely on a fiber core which does not contain damping fluorescent material.

The arrangement of FIG. 5 illustrates how a sensor of the invention can be used to transmit light between two parts which move relative to each other. In order to transmit signals from a stationary part 21 into a cylindrical tube 22 which is rotatably mounted therein, a lamp 23 is modulated with information to be transmitted and illuminates the rotatable tube 22. The collector 24 of a sensor of the invention is developed in the form of a multi-turn helical winding around the cylindrical tube 22, located within the illuminated region. A detector 25 is positioned for exposure to both ends of collector 24 and therefore continuously supplies a signal proportional to the emitted light power of the lamp 23, independently of the angle of rotation of the pipe 22. Such an arrangement will be seen to be useful, for example, when direct electrical contact via a conductive collector ring cannot be tolerated, as when the danger of spark formation is to be avoided in an explosion-sensitive environment.

What is claimed is:

1. A radiation sensor containing fluorescent material in which the radiation to be detected is absorbed and the fluorescent light produced is conducted onto the photosensitive surface of a detector, characterized by the fact that the sensor consists of a collector in the form of at least one optical fiber having first and second ends arranged in the form of a surface of a regular shape, the optical fibers having a cladding of material which is transparent to the radiation to be detected and a core which contains the fluorescent material, and at least one detector for the fluorescent radiation, said detector being connected to at least one of the ends of the optical fibers.

2. A radiation sensor according to claim 1, characterized by the fact that the collector is developed as a capillary whose cavity is filled with fluorescing liquid.

3. A radiation sensor according to claim 1, characterized by the fact that the collector is developed as a plastic fiber and the core contains a fluorescing organic dyestuff.

4. A radiation sensor according to claim 1, characterized by the fact that the collector is a glass fiber and the core of the fiber is doped with metal compounds capable of fluorescence.

5. A radiation sensor according to claim 1, characterized by the fact that the optical fiber is bifilar-wound and both optical fiber ends are coupled to the detector.

6. A radiation sensor according to claim 5, characterized by the fact that the optical fiber comprises a plurality of parallel-connected fibers which are coupled to a common detector.

7. A radiation sensor according to claim 1, characterized by the fact that the collector is covered by a filter.

8. A radiation sensor in accordance with claim 1, characterized by its use for transmitting radiation between parts which are moved relative to each other, one of the two moving parts including a source of radiation while the sensor is arranged on the other part so that a part of the collector is always struck by the radiation.

9. A radiation sensor according to claim 8, characterized by the fact that the collector (24) is placed around a shaft (22) which is turnable relative to the source of radiation (23).

* * * * *